(12) United States Patent
Hata et al.

(10) Patent No.: US 7,069,648 B2
(45) Date of Patent: Jul. 4, 2006

(54) COMPONENT MOUNTING METHOD

(75) Inventors: Kanji Hata, Katano (JP); Noriaki Yoshida, Ikeda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/882,399

(22) Filed: Jul. 2, 2004

(65) Prior Publication Data
US 2004/0237297 A1 Dec. 2, 2004

Related U.S. Application Data

(60) Division of application No. 09/010,490, filed on Jan. 21, 1998, now Pat. No. 6,789,310, which is a continuation of application No. 08/740,992, filed on Nov. 5, 1996, now Pat. No. 5,778,525.

(30) Foreign Application Priority Data

Nov. 6, 1995 (JP) ................... 7-286969

(51) Int. Cl.
*H05K 3/30* (2006.01)

(52) U.S. Cl. .............. 29/832; 29/834; 29/836; 29/740; 29/743

(58) Field of Classification Search .......... 29/833–837, 29/740–743; 198/586, 817; 294/64.1, 2; 414/737, 751.1; 901/16
See application file for complete search history.

(56) References Cited

U.S. PATENT DOCUMENTS

| | | | |
|---|---|---|---|
| 3,650,140 A | 3/1972 | Zmuda | |
| 4,231,153 A | 11/1980 | Browne | |
| 4,480,780 A | 11/1984 | Claeskens et al. | |
| 4,573,262 A | 3/1986 | Dornes et al. | |
| 4,624,050 A * | 11/1986 | Hawkswell | ........... 29/740 |
| 4,631,812 A | 12/1986 | Young | |
| 4,875,285 A | 10/1989 | Haan et al. | |

(Continued)

FOREIGN PATENT DOCUMENTS

EP 0 453 369 10/1991

(Continued)

OTHER PUBLICATIONS

"A novel surface acoustic wave resonator for compact, low-cost oscillators"; Fleischmann, B.; Allen, D.; Ultrasoncis Symposium, 1990. Proceedings., IEEE; Dec. 4-7, 1990; pp. 95-98.

*Primary Examiner*—Minh Trinh
(74) *Attorney, Agent, or Firm*—Wenderoth, Lind & Ponack, L.L.P.

(57) ABSTRACT

Disclosed is a component mounting method. Moved in first and second orthogonal directions is a first mounting head section having first nozzles. The first mounting head is rotated such that the first nozzles rotate and successively pickup components from a first component supply table arranged on one side of a board transfer path. These components are then successively mounted onto a board positioned in the board transfer path. Moved in third and fourth orthogonal directions is a second mounting head section having second nozzles. The second mounting head section is rotated such that the second nozzles rotate and successively pickup components from a second component supply table arranged on an opposite side of the board transfer path. These components are then successively mounted onto the board while positioned in the board transfer path.

8 Claims, 7 Drawing Sheets

U.S. PATENT DOCUMENTS

| | | | |
|---|---|---|---|
| 5,002,448 A * | 3/1991 | Kamijima et al. | 29/739 |
| 5,115,559 A | 5/1992 | Oyama | |
| 5,233,745 A | 8/1993 | Morita | |
| 5,323,528 A | 6/1994 | Baker | |
| 5,410,801 A * | 5/1995 | Shiloh et al. | 29/740 |
| 5,456,001 A | 10/1995 | Mori et al. | |
| 5,541,834 A | 7/1996 | Tomigashi et al. | |
| 5,579,572 A | 12/1996 | Kashiwagi et al. | |
| 5,651,176 A | 7/1997 | Ma et al. | |
| 5,692,292 A | 12/1997 | Asai et al. | |
| 5,711,065 A | 1/1998 | Asai et al. | |
| 5,740,604 A | 4/1998 | Kitamura et al. | |
| 5,741,114 A | 4/1998 | Onodera | |
| 5,778,525 A * | 7/1998 | Hata et al. | 29/836 |
| 6,408,505 B1 * | 6/2002 | Hata et al. | 29/740 |
| 6,789,310 B1 * | 9/2004 | Hata et al. | 29/740 |
| 6,935,017 B1 * | 8/2005 | Hata et al. | 29/740 |

FOREIGN PATENT DOCUMENTS

| | | |
|---|---|---|
| JP | 54-043381 | 4/1979 |
| JP | 60-7200 | 1/1985 |
| JP | 61-39000 | 3/1986 |
| JP | 63-178596 | 7/1988 |
| JP | 1-187898 | 7/1989 |
| JP | 2-54999 | 2/1990 |
| JP | 3-30499 | 2/1991 |
| JP | 03-131100 | 6/1991 |
| JP | 03-203294 | 9/1991 |
| JP | 06077693 A | 3/1994 |
| JP | 07-22787 | 1/1995 |
| JP | 07-136875 | 5/1995 |
| RU | 1829131 | 7/1993 |
| WO | 85/03404 | 8/1985 |

* cited by examiner

COMPONENT MOUNTING METHOD

This application is a divisional of U.S. application Ser. No. 09/010,490, filed Jan. 21, 1998 and now U.S. Pat. No. 6,789,310, which is a continuation of U.S. application Ser. No. 08/740,992, filed Nov. 5, 1996, which is now U.S. Pat. No. 5,778,525.

BACKGROUND OF THE INVENTION

The present invention relates to component mounting apparatus and method for automatically mounting a variety of components such as electronic components onto a printed circuit board or the like, and a component mounting equipment including the apparatuses.

Generally, in an electronic component mounting apparatus, a number of component supply means are mounted in parallel to one another on a component supply table. In a component mounting stage, the component supply means are successively positioned in a specified component supply position according to a sequence of mounting components while moving the component supply table in a direction in which the component supply means are arranged in parallel. Then, each of the components at the component supply means is taken out by suction by a mounting head section, and the components are transferred to a circuit board positioned in the circuit board positioning section to be subjected to a component mounting process.

This type of conventional component mounting apparatus will be described with reference to FIG. 6 showing a perspective view of it and FIG. 7 showing a schematic plan view of it. In FIG. 6, at the front of an apparatus body 1 is provided a board positioning section 4 for positioning a circuit board P supplied from a board supply means 2 in a mounting position, and the circuit board P mounted with the required components in the board positioning section 4 is discharged by a board discharge means 3. On the other hand, at the rear of the apparatus body 1 is provided a component supply section 7, and a rotary type mounting head section 8 is provided between the component supply section 7 and the aforementioned board positioning section 4 as shown in FIG. 7.

In the component supply section 7, two component supply tables 10 and 11 are laterally movably provided independently of each other on a guide rail 9. The component supply tables 10 and 11 are mounted with a number of component supply means 12 arranged in parallel to one another in a direction in which the component supply tables 10 and 11 move. There is illustrated generally a so-called parts cassette as the component supply means 12, and it will be simply described below. That is, electronic components of an identical type are stored and arranged at regular intervals on a carrier tape while being wound around a reel 13 as covered with a cover tape. By drawing out the carrier tape from the reel 13 to feed at a pitch equal to the storage intervals of the components and taking up the cover tape, the electronic component located at the leading end is positioned in a component supply position A opposite to a component suction head 14 of the mounting head section 8.

Furthermore, as shown in FIG. 7, the mounting head section 8 is constructed by providing a plurality of component suction heads 14 at regular angular intervals on an identical circle of a rotary table (not shown) provided rotatably around a vertical axis. Each component suction head 14 is designed to suck a component by vacuum suction means. Upon intermittently rotating the rotary table, it is stopped in steps in the component supply position A and a component mounting position B in order to concurrently perform receiving of each component from the component supply means 12 and mounting of each component onto the circuit board P. While one component supply table 10 is supplying components, the other component supply table 11 that is retreating in a standby position performs changing of component supply means 12 and replenishing of components thereby achieving preparation so that the component mounting apparatus can be operated continuously.

In recent years, there has been a growing trend in that the types of circuit boards P to be manufactured and the types of components to be mounted on the circuit boards P are increasing. In order to cope with the above, one solution to be considered is to increase the number of component supply means 12 to be mounted on the component supply tables 10 and 11. However, in such a case, the component supply tables 10 and 11 are to be elongated sidewise in order to increase the number of component supply means 12. Consequently, the length of the entire component supply section 7 becomes very long, and this leads to a degraded space utilization efficiency, reducing the productivity per floor area.

A more important issue is that the component supply tables 10 and 11 are fed at a pitch in accordance with taking out the components by the mounting head section 8, and therefore, the following inconvenience occurs. That is, when the component supply tables 10 and 11 increase in weight due to the increase of their lengths, not only is a greater drive power required to move the component supply tables 10 and 11 but also the inertial force of the component supply tables 10 and 11 increases. Therefore, vibration in feeding the component supply tables 10 and 11 at a pitch significantly increases. Consequently, it is impossible to increase the component supply rate, or the component mounting operation speed.

SUMMARY OF THE INVENTION

Accordingly, it is an object of the present invention to provide a component mounting apparatus and method capable of increasing the component mounting operation speed without dimensionally increasing the whole apparatus even when the types of boards and the number of components to be mounted on each board increase.

In accomplishing these and other objects, according to a first aspect of the present invention, there is provided a component mounting apparatus comprising:

a pair of component supply tables on which components are accommodated and which are arranged on both sides of a board mounting position where a board is positioned;

a first mounting head section for successively picking up the components at one of the component supply tables and thereafter successively mounting the picked-up components onto the board; and a second mounting head section for successively picking up the components at the other of the component supply tables and thereafter successively mounting the picked-up components onto the board, wherein the first and second mounting head sections are independently operated.

According to a second aspect of the present invention, there is provided the component mounting apparatus as described in the first aspect, wherein the first and second mounting head sections are controlled mutually in operation in accordance with a timing at which, when one of them carries out a component picking-up operation for picking up the components from the component supply table, the other of them carries out a component mounting operation for mounting the picked-up components onto the board.

According to a third aspect of the present invention, there is provided the component mounting apparatus as described in the first aspect, wherein one of the first and second mounting head section has component suction nozzles sucking the components at one time.

According to a fourth aspect of the present invention, there is provided the component mounting apparatus as described in the second aspect, wherein one of the first and second mounting head section has component suction nozzles sucking the components at one time.

According to a fifth aspect of the present invention, there is provided a component mounting equipment comprising:

a plurality of component mounting apparatuses each of which was described in the description of the first aspect, wherein a board transfer path along which the board is supplied to the board mounting position of the apparatus and discharged from the board mounting position of the apparatus by a board transfer device is provided so that the board transfer path connects the board mounting positions of the component mounting apparatuses, and the component supply tables of the component mounting apparatuses are arranged on both sides of the board mounting positions in the board transfer path.

According to a sixth aspect of the present invention, there is provided a component mounting equipment comprising:

a plurality of component mounting apparatuses each of which was described in the description of the second aspect, wherein a board transfer path along which the board is supplied to the board mounting position of the apparatus and discharged from the board mounting position of the apparatus by a board transfer device is provided so that the board transfer path connects the board mounting positions of the component mounting apparatuses, and the component supply tables of the component mounting apparatuses are arranged on both sides of the board mounting positions in the board transfer path.

According to a seventh aspect of the present invention, there is provided the component mounting equipment as described in the fifth aspect, wherein the components to be mounted onto the single board are all distributed into groups by type, and the components of the groups are accomodated in the component supply tables of the component mounting apparatus as assigned thereto.

According to an eighth aspect of the present invention, there is provided the component mounting equipment as described in the sixth aspect, wherein the components to be mounted onto the single board are all distributed into groups by type, and the components of the groups are accommodated in the component supply tables of the component mounting apparatuses as assigned thereto.

According to a ninth aspect of the present invention, there is provided a component mounting method comprising steps of:

picking up by a first mounting head section components from one of a pair of component supply tables on which the components are accommodated and which are arranged on both sides of a board mounting position where a board is positioned, the first mounting head section successively picking up the components at one of the component supply tables;

thereafter successively mounting the components picked up by the first mounting head section onto the board;

picking up by a second mounting head section components from the other of the pair of component supply tables, the second mounting head section successively picking up the components at the other of the component supply tables; and thereafter successively mounting the components picked up by the second mounting head section onto the board, wherein the picking-up and mounting steps of the first mounting head section and the picking-up and mounting steps of the second mounting head section are independently carried out.

According to a tenth aspect of the present invention, there is provided the component mounting method as described in the ninth aspect, wherein the picking-up step of the first mounting head section and the mounting step of the second mounting head section are carried out at the same time, and the mounting step of the first mounting head section and the picking-up step of the second mounting head section are carried out at the same time.

According to an eleventh aspect of the present invention, there is provided the component mounting method as described in the ninth aspect, wherein in a component mounting equipment comprising a plurality of component mounting apparatuses each of which comprises the first and second mounting head sections and the pair of component supply tables between which a board transfer path along which the board is supplied to the board mounting position of the apparatus and discharged from the board mounting position of the apparatus by a board transfer device is provided so that the board transfer path connects the board mounting positions of the component mounting apparatuses, and the component supply tables of the component mounting apparatuses are arranged on both sides of the board mounting positions in the board transfer path, the picking-up and mounting steps of the first mounting head section and the picking-up and mounting steps of the second mounting head section are sequentially carried out.

According to a twelfth aspect of the present invention, there is provided the component mounting method as described in the eleventh aspect, wherein the picking-up step of each of the first mounting head sections and the mounting step of each of the corresponding second mounting head sections are carried out at the same time, and the mounting step of each of the first mounting head sections and the picking-up step of each of the corresponding second mounting head sections are carried out at the same time.

According to a thirteenth aspect of the present invention, there is provided the component mounting equipment as described in the eleventh aspect, wherein the components to be mounted onto the single board are all distributed into groups by type, and the components of the groups are accommodated in the component supply tables of the component mounting apparatuses as assigned thereto.

According to a fourteenth aspect of the present invention, there is provided the component mounting equipment as described in the twelfth aspect, wherein the components to be mounted onto the single board are all distributed into groups by type, and the components of the groups are accommodated in the component supply tables of the component mounting apparatuses as assigned thereto.

With the above arrangement, the component supply table is installed fixedly, and therefore, it becomes free of vibration regardless of the number of mounted component supply means which can be mounted thereon. The mounting head section is a robot type which sucks a plurality of components from the component supply table at one time and thereafter successively mounts the components to specified portions of the board. Therefore, even when the number of components to be mounted on a board increases, the component mounting operation speed can be remarkably increased further than in the conventional apparatus in which the component supply table is fed at a pitch with respect to the rotary type mounting head section.

Furthermore, components can be mounted by the two of the first and second mounting head sections onto the of the board positioned in a single board mounting position, and therefore, the component mounting operation speed can be further increased.

With the above arrangement of the fifth and sixth aspects and the eleventh and twelfth aspects, by mounting different components on the component supply tables installed at each of the component mounting apparatuses, the component supply tables are inevitably arranged on both sides of the board transfer path along it even when the types and the number of components to be mounted onto the board increase. Therefore, the equipment does not dimensionally increase as a whole without expanding significantly in the direction of the board transfer path. Furthermore, the mounting head sections of the component mounting apparatuses operate at high speed and the component supply tables are fixedly installed, and therefore, the component mounting operation speed can be increased.

With the above arrangement of the thirteenth and fourteenth aspects, when the types of boards are increased, the equipment can cope with it only by replacing a specified one of the component supply tables installed at the respective component mounting apparatuses with a component supply table mounted with components required type.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE EMBODIMENTS

Figure 1:
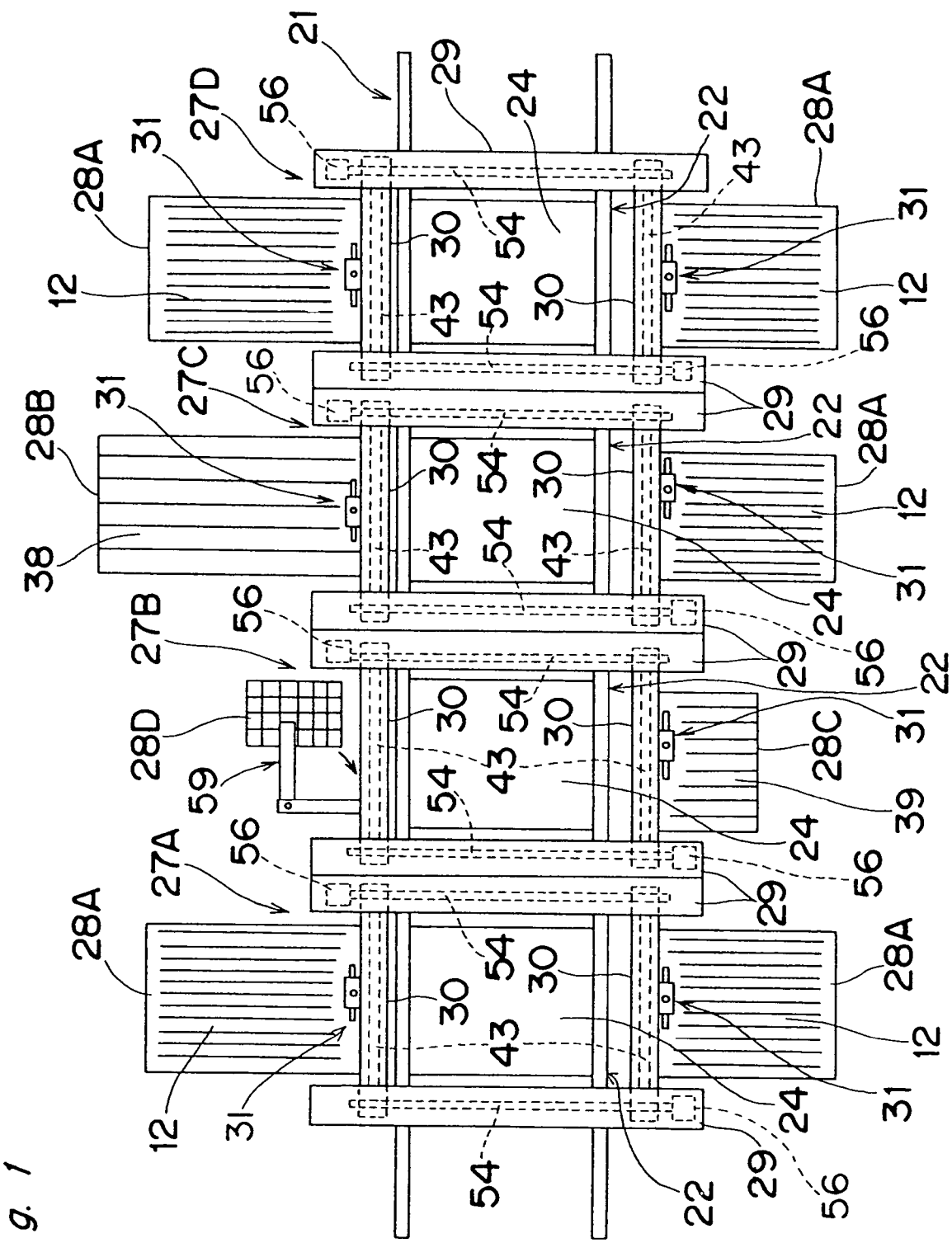
FIG. 1 is a schematic plan view schematically showing component mounting equipment according to an embodiment of the present invention.

Before the description of the present invention proceeds, it is to be noted that like parts are designated by like reference numerals throughout the accompanying drawings.

An embodiment of the present invention will be described below with reference to FIGS. 1 through 4.

FIG. 1 is a schematic plan view schematically showing component mounting equipment (component mounting line) according to an embodiment of the present invention. In the figure, four component mounting apparatuses 27A through 27D are provided along a board transfer path 21, and four board transfer means 22 are provided for the component mounting apparatuses 27A through 27D along the board transfer path 21 in the lateral direction so that each board transfer means 22 supplies a board to be mounted with components to a board mounting position of one of the component mounting apparatuses and discharges the board therefrom. The component mounting apparatuses 27A through 27D have an identical basic structure, and therefore, the component mounting apparatus 27D is taken as an example to be described below with reference to FIG. 2 that shows a perspective view of it and FIG. 3 that shows a plan view of its operating mechanism section.

Figure 2:
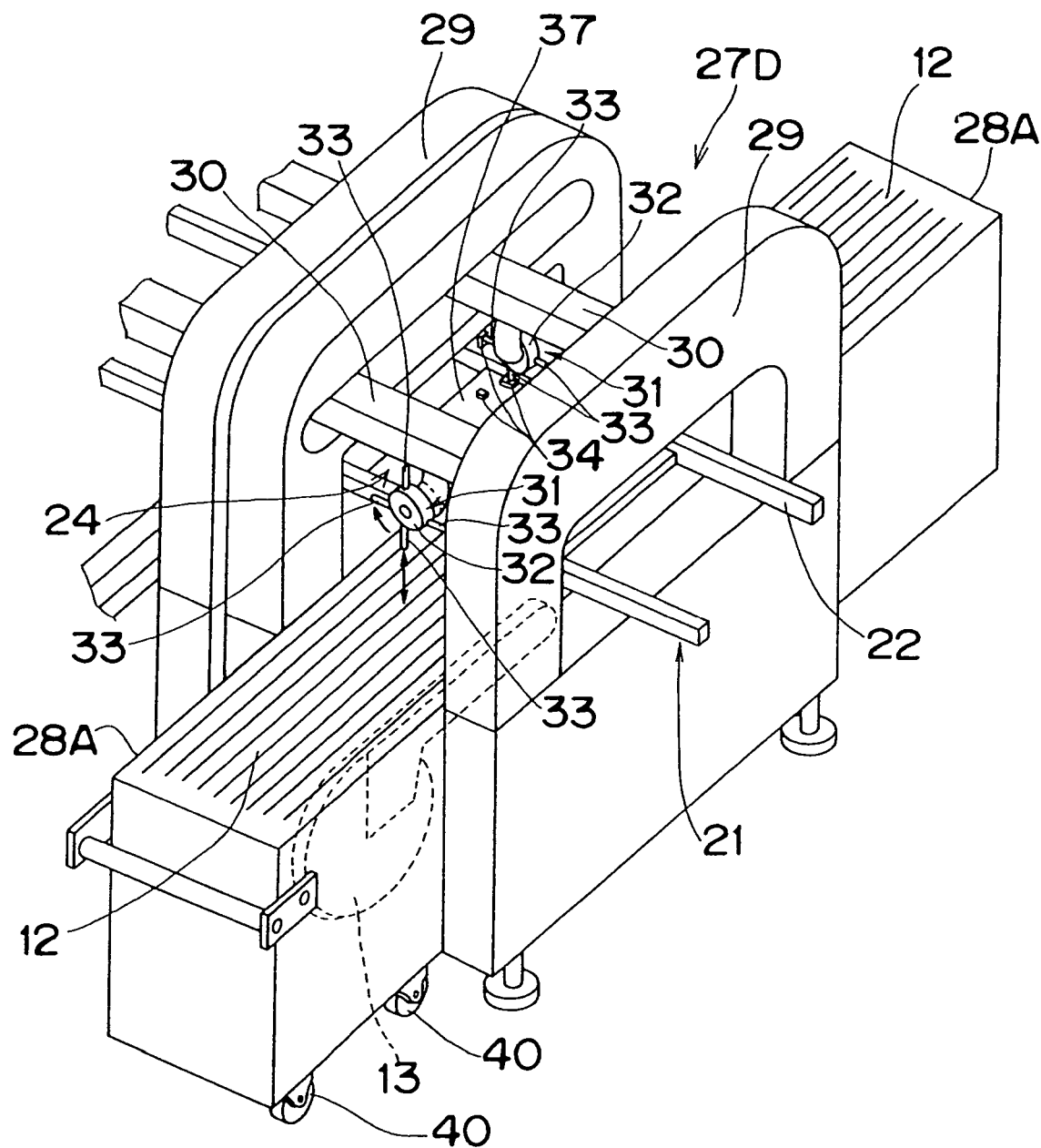
FIG. 2 is a perspective view of an embodiment of the component mounting apparatus of the present invention, the apparatus being a part of the above equipment.

In the component mounting apparatus 27D shown in FIG. 2, a laterally provided pair of inverted U-shaped support frames 29 are arranged in parallel to each other along the board transfer path 21 while allowing the board transfer path 21 to penetrate them. Between both the support frames 29 are arranged two operating frames 30 in parallel to each other across the frames 29. The operating frames are supported individually movably in a direction perpendicular to the board transfer path 21. To each operating frame 30 is mounted a mounting head section 31 movably along the operating frame 30. At the mounting head section 31, four component suction nozzles 33 are provided at regular intervals (at intervals of 90°) around a rotary member 32 that is rotatably supported around a horizontal axis. Upon rotating the rotary member 32 at a pitch equal to each interval of the component suction nozzles 33, the component suction nozzles 33 are selectively and sequentially directed downward to suck a component 34 from a component supply table 28A and mount the sucked component 34 onto a circuit board 37 located at the board mounting position where the board 37 is positioned by a board positioning section 24.

Between both the support frames 29 are inserted the component supply tables 28A from both depthwise sides 20 as moved by casters 40, and thereafter they are fixedly installed in specified positions. The component supply table 28A is provided with component supply means 12 comprised of parts cassettes provided with the aforementioned reels 13. Other than this, as shown in FIG. 25 1, a component supply table 28B mounted with a stick-shaped component supply means 38 at which components stored in a pipe member are successively fed to a take-out position, a component supply table 28C on which bulk components 39 are placed, and a tray-shaped component supply table 28D are installed at the component mounting apparatuses 27A through 27D. It is to be noted that the tray-shaped component supply table 28D is provided with a mounting head section 59 having a pivot arm shape for taking out the components thereof.

Figure 3:
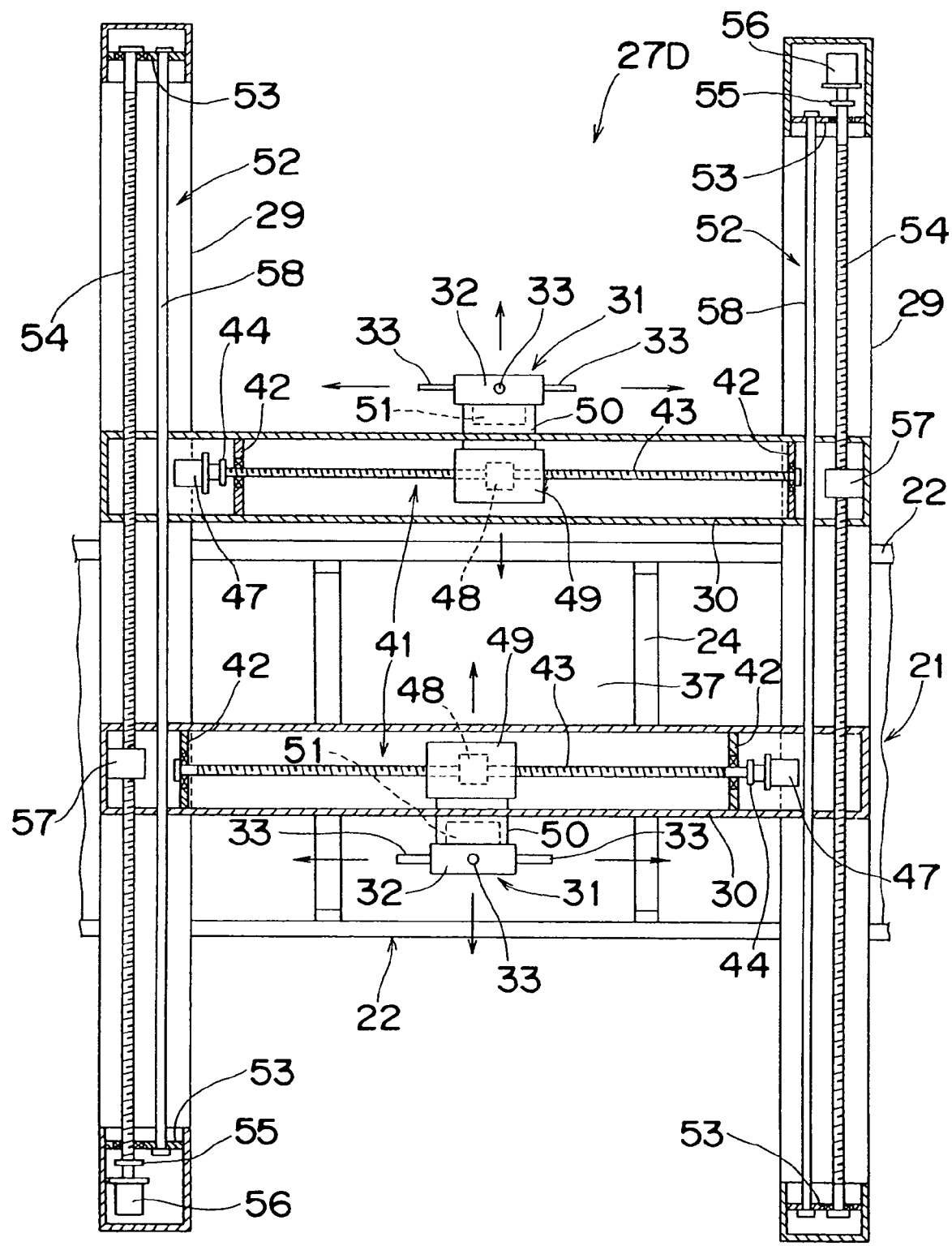
FIG. 3 is a plan view of an operating mechanism section of the above apparatus.

In FIG. 3, each operating frame 30 houses therein a head positioning mechanism section 41 for moving the mounting head section 31 in the lengthwise direction of the board transfer path 21.

The head positioning mechanism section 41 is comprised of a ball thread 43 that is rotatably supported across a pair of support plates 42 fixed to both ends of each operating frame 30, a step motor 47 for rotatively driving the ball thread 43 via a connecting means 44, and a moving member 49 in which a nut 48 meshed with the ball 20 thread 43 is internally fixed and moved in accordance with the rotation of the ball thread 43. The mounting head section 31 is fixed to the moving member 49 via a head holder 50, and the head holder 50 is internally provided with a known head elevation mechanism section 51 for vertically moving the mounting head section 31.

Figure 5:
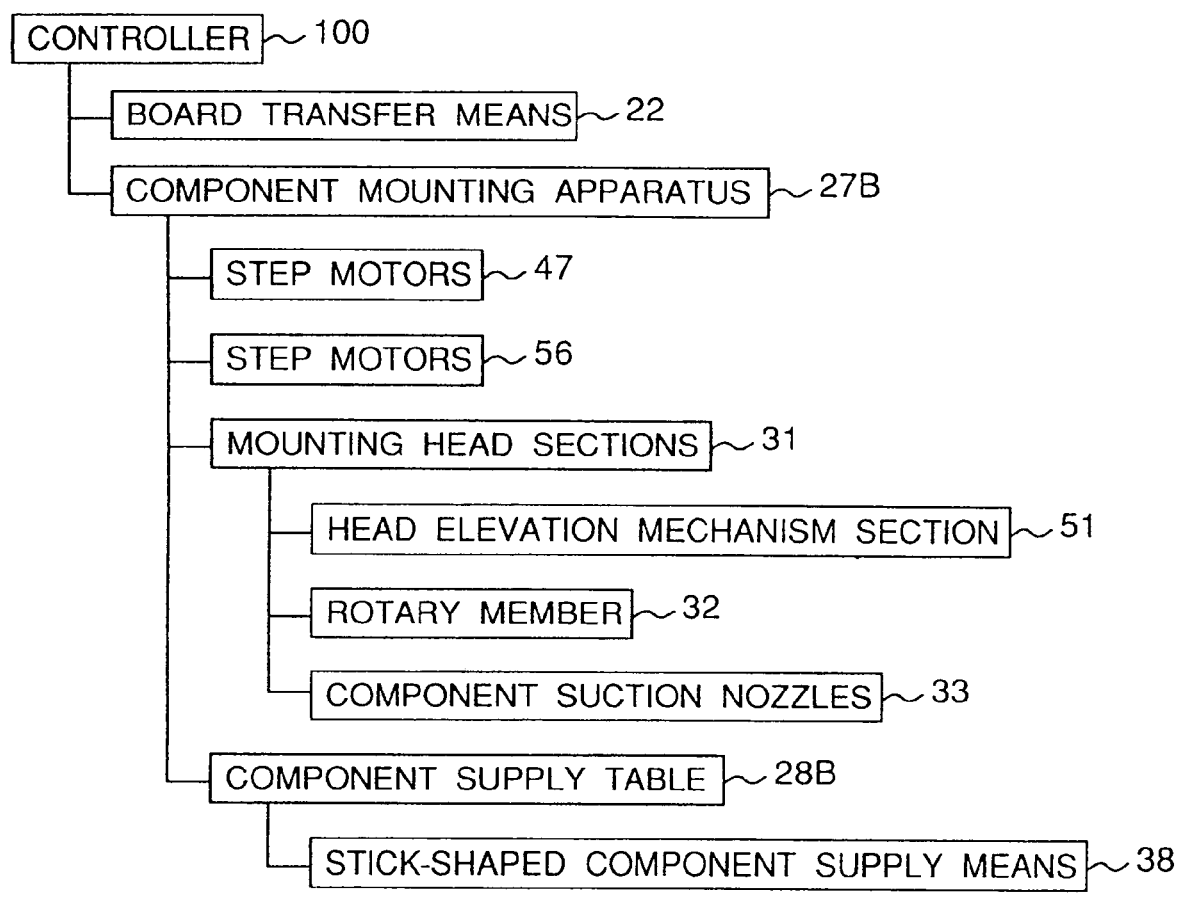
FIG. 5 is a block diagram showing construction for performing the control operation of the apparatus.
Figure 6:
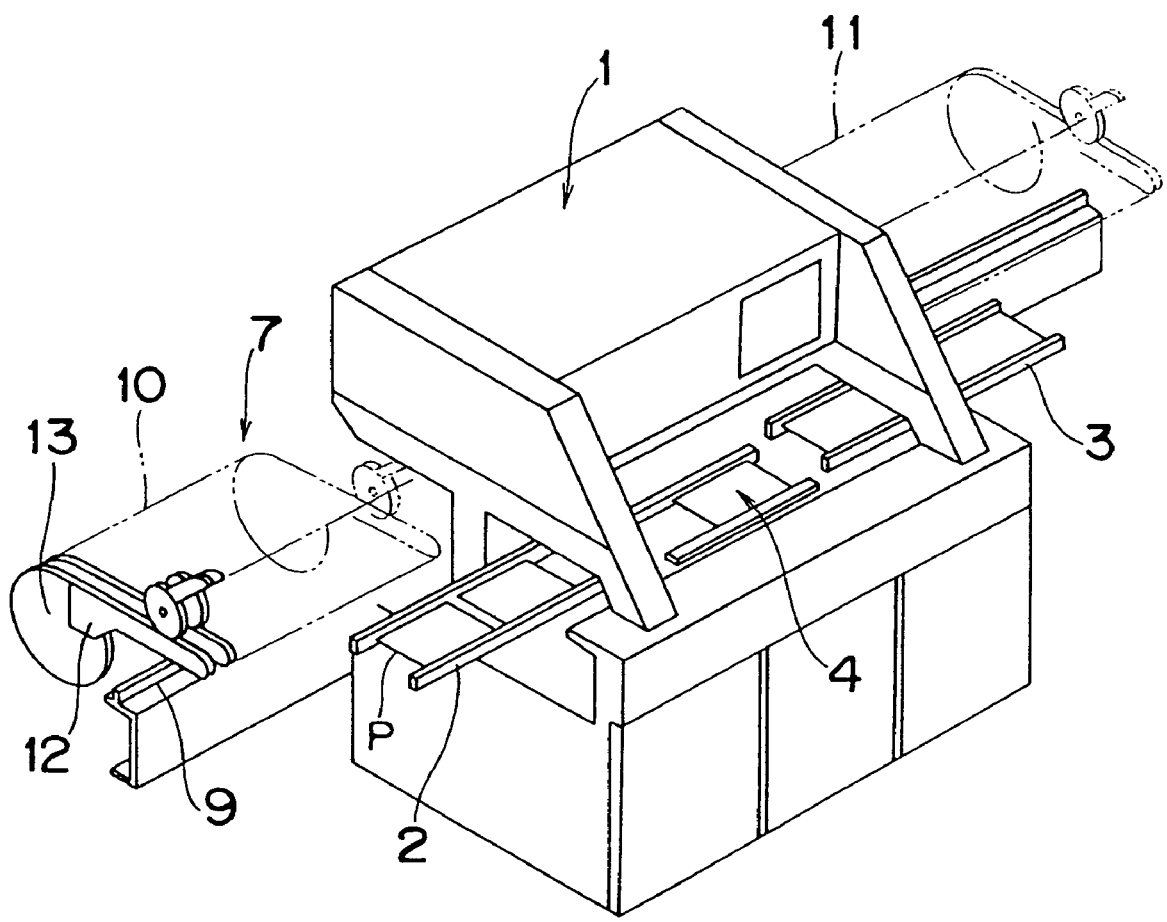
FIG. 6 is a perspective view of a conventional component mounting apparatus.
Figure 7:
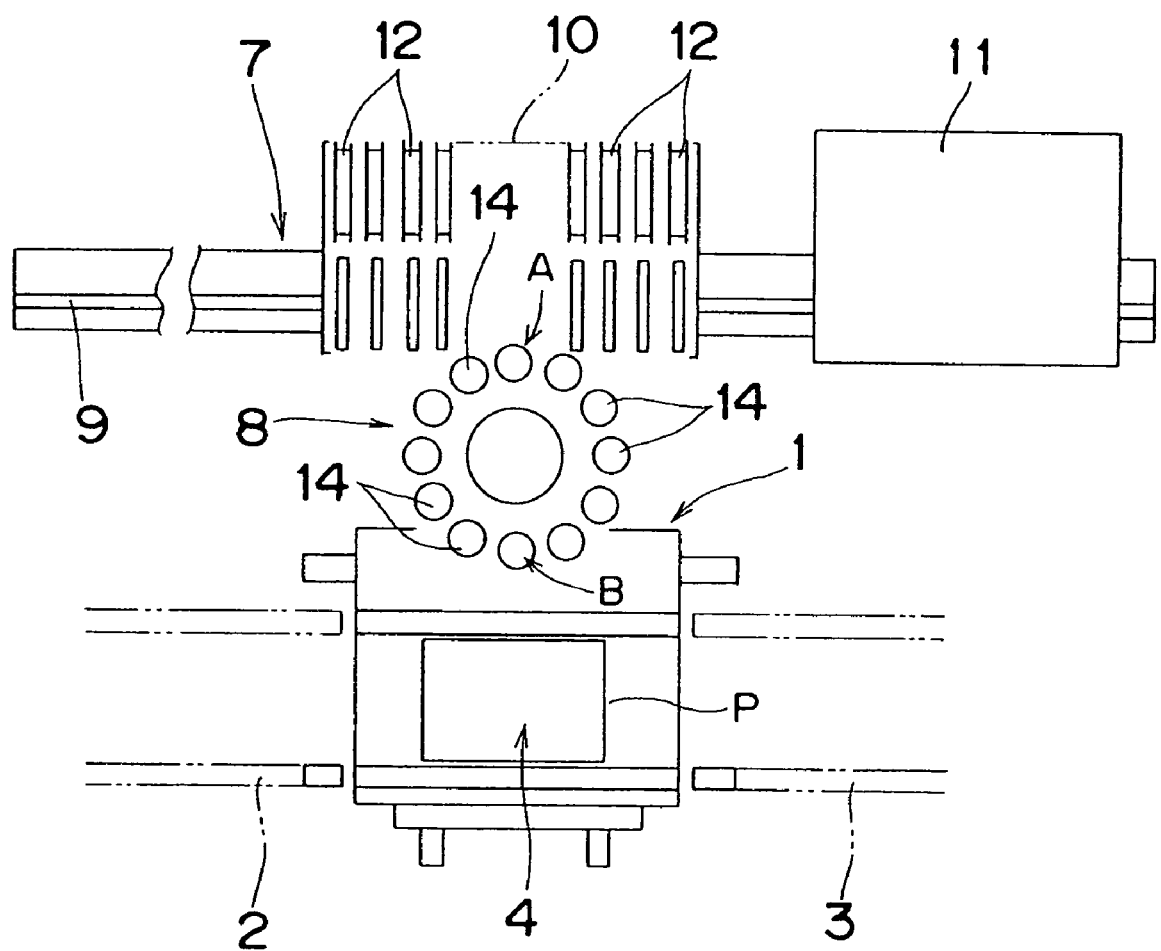
FIG. 7 is a schematic plan view of the above conventional apparatus.

Each of the support frames 29 houses therein a head feed mechanism section 52 for moving the head positioning mechanism section 41 via each operating frame 30 in a direction perpendicular to the board transfer path The head feed mechanism section 52 is comprised of a ball thread 54 that is rotatably supported across a pair of support plates 53 fixed to both ends of each support frame 29, a step motor 56 for rotatively driving the ball thread 54 via a connecting means 55, a moving member 57 that is fixed to an end portion of each operating frame 30 as meshed with the ball thread 54 and operates to move the operating frame 30 in accordance with the rotation of the ball thread 54, and a guide shaft 58 that is fixed across the support plates 53 and operates to slidably support the operating frame 30 while allowing the guide shaft 58 to penetrate the other end of the operating frame 30. A controller 100 controls the operations of the apparatuses 27A–27D and the board transfer means 22, because it is connected to them as shown in FIG. 5 in which the connection structure of the apparatus 27B is shown as one example. The other connection structure of the apparatuses 27A, 27C, and 27D are similar to the apparatus 27B.

Figure 4:
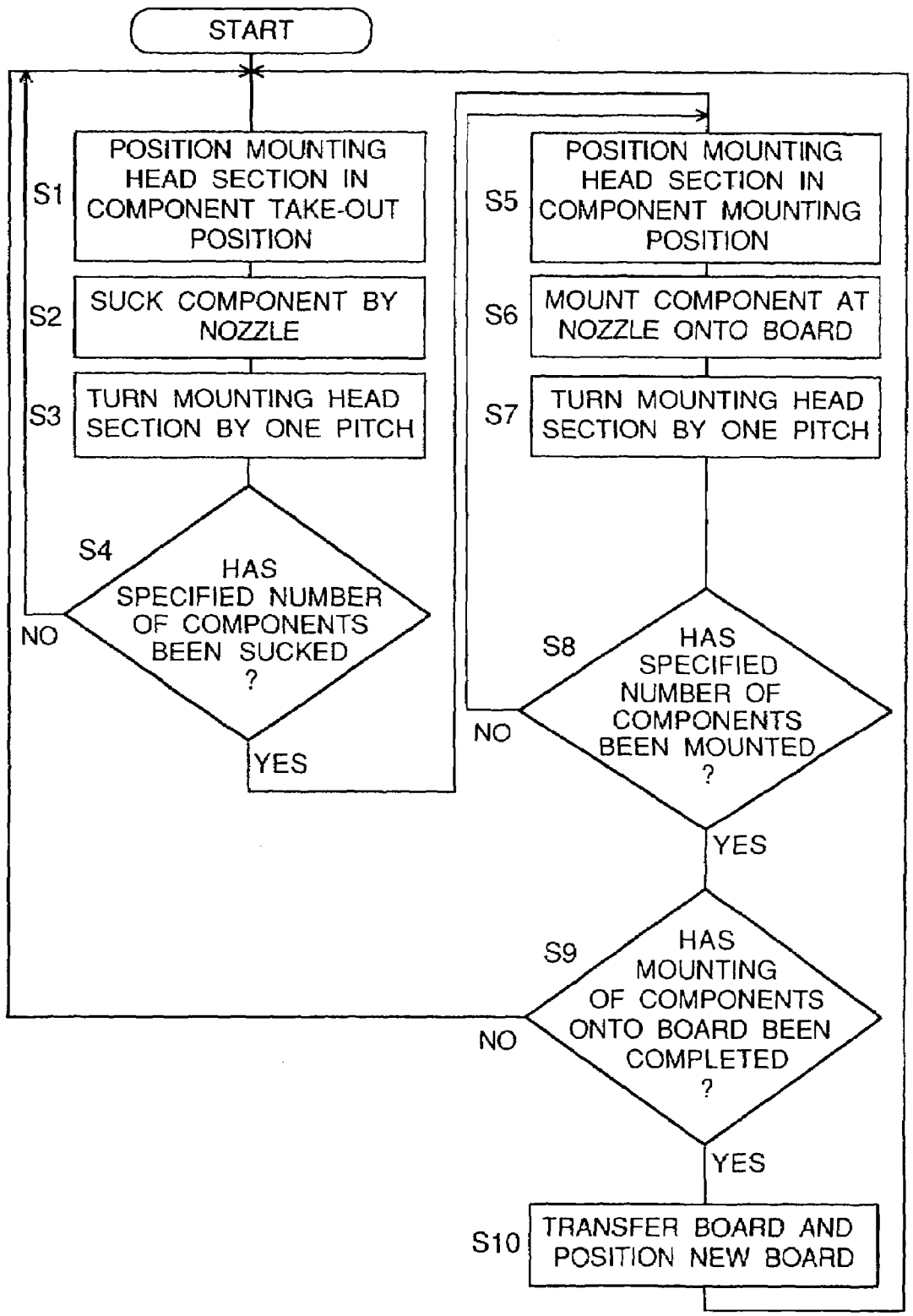
FIG. 4 is a flow chart of the above apparatus.

The operation of the aforementioned component mounting equipment will be described next with reference to a flowchart of FIG. 4. In the component mounting apparatuses 27A through 27D, the mounting head sections 31 are controlled in accordance with a timing at which, while one mounting head section 31 is sucking components 34 from one of the component supply tables 28A through 28D, the other mounting head section 31 mounts the components 34 onto the circuit board 37. Since both the mounting head sections 31 execute an identical operation except for an operating timing shift, only the operation of one mounting head section 31 will be now described.

First, the mounting head section 31 is moved to a position just above the component 34 to be sucked by suction on one of the component supply tables 28A through 28D and then positioned (step S1). That is, upon rotating the step motor 47 of the head positioning mechanism section 41 by a specified angle in the required rotational direction, the moving member 49 moves in the lengthwise direction of the board transfer path 21 by the ball thread 43 that is rotating integrally with the step motor 47, and the mounting head section 31 is moved to a specified component take-out position on the one of the component supply tables 28A through 28D. In this stage, in regard to the other component supply tables 28A through 28C except for the tray-shaped component supply table 28D, the component take-out position is positioned in a straight line extending along the board transfer path 21. Consequently, the mounting head section 31 does not move as positioned in the position until such components as the parts cassette or the stick fronting the mounting head section 31 deplete.

When the mounting head section 31 is positioned, the head elevation mechanism section 51 operates to move down the mounting head section 31, the component suction nozzle 33 sucks a component 34, and thereafter the mounting head section 31 is slightly moved up by the head elevation mechanism section 51 (step S2). Subsequently, the rotary member 32 of the mounting head section 31 is rotated by one pitch, and the next component suction nozzle 33 is made to front the component take-out position (step S3). In this stage, it is decided whether or not the mounting head section 31 has completed the suction of a specified number (four in this embodiment) of components 34 (step S4). If it has not been completed, the same operation as above will be repeated to suck the specified number of components 34.

When the suction of the specified number of components 34 has been completed, the step motor 56 of the head feed mechanism section 52 and the step motor 47 of the head positioning mechanism section 41 are simultaneously driven to move the mounting head section 31 onto the board positioning section 24 via the operating frame 30 in accordance with the rotation of the ball thread 54 and then position it just above a specified component mounting position of the circuit board 37 by the head positioning mechanism section 41 (step S5). Then, the head elevation mechanism section 51 is driven to mount the components that have been held by the component suction nozzle 33 as sucked thereto onto the circuit board 37 (step S6). After the mounting head section 31 is slightly moved up by the head elevation mechanism section 51, the mounting head section 31 is moved to a position just above the next component mounting position of the circuit board 37 and then positioned by the operations of the head positioning mechanism section 41 and the head feed mechanism section 52, and the rotary member 32 is rotated by one pitch, so that the component to be mounted next is made to front the component mounting position (step S7).

In this stage, it is decided whether or not the mounting of all the components 34 that have been held by the mounting head section 31 as sucked thereto has been completed (step S8). If it has not been completed, the same operation as above will be repeated to mount all the components 34 onto the specified positions of the circuit board 37.

When the specified number of components has been completed at step S8, it is decided whether or not the mounting of all the components 34 distributed to the component mounting apparatuses 27A through 27D for the circuit board 37 positioned in the board positioning section 24 has been completed (step S9). If it has not been completed, the mounting head sections 31 are moved again above the component supply tables 28A through 29D to repeat the suction of the components 34 from the component supply tables 28A through 28D and the mounting of the components 34 onto the circuit board 37 in a manner similar to the above until the mounting of all the components 34 onto the circuit board 37 is completed. When the mounting of all the components 34 onto the circuit board 37 is completed, each circuit board 37 positioned in the board transfer path 21 is fed by a specified pitch to be positioned in the board positioning sections 24 of the component mounting apparatuses 27A through 27D for the next process (step S10), and an operation similar to the above will be repeated.

In the above component mounting equipment, mutually different components can be mounted on the component supply tables 28A through 28D of the plurality (four in this embodiment) of component mounting apparatuses 27A through 27D provided in parallel to one another along the board transfer path 21. Therefore, when the types and the number of components 34 to be mounted onto the circuit board 37 increase, these components are mounted on the component supply tables 28A through 28D as distributed into groups classified by type. With this arrangement, since the component supply tables 28A through 28D are mounted with only the components 34 of the respective groups, the tables are not dimensionally increased. Furthermore, since the component supply tables 28A through 28D are installed perpendicularly to the board transfer path 21 at the component mounting apparatuses 27A through 27D, the equipment is not dimensionally increased as a whole without significantly expanding in the direction of the board transfer path 21.

Furthermore, since the mounting head section 31 of the component mounting apparatuses 27A through 27D only operates and the component supply tables 28A through 28D are fixedly installed, the tables become free of vibration regardless of the number of mounted component supply means 12 and 38. Furthermore, the mounting head section 31 sucks at one time a plurality of components 34 from the component supply tables 28A through 28D and successively mounts the 20 components 34 onto the specified portions of the circuit board 37. Furthermore, the component mounting apparatuses 27A through 27D are each provided with a pair of mounting head sections 31 and controls the mounting head sections 31 so that, while one is sucking components 34, the components 34 that are held by the other as sucked thereto are mounted to the circuit board 37. With the above arrangement, even when the types and the number of components 34 to be mounted onto the circuit board 37 increase, the component mounting operation speed can be remarkably increased further than in the conventional apparatus in which the component supply table is fed at a pitch with respect to the rotary type mounting head section.

When the types of circuit boards 37 increase, it can be coped with only by replacing a part of the component supply tables 28A through 28D installed at the component mounting apparatuses 27A through 27D with component supply tables 28A through 28D mounted with required components 34. It is to be noted that the component mounting apparatuses 27A through 27D can be also used singly.

According to the present invention as described above, there is provided a robot type mounting head section in which the component supply tables are installed fixedly, and a plurality of components are sucked at one time from the component supply tables and thereafter transferred to be successively mounted onto the specified portions of the board. With this arrangement, even when the number of components to be mounted onto the board increases, the component mounting operation speed can be remarkably increased further than in the conventional structure in which the component supply table is fed at a pitch with respect to the rotary type mounting head section. Furthermore, since the laterally provided pair of first and second mounting head sections are mutually controlled in operation in accordance with a timing at which, when one is located on the component supply table, the other is located on the board positioning section. With this arrangement, components can be mounted onto a single board by a plurality of mounting head sections, and therefore, the component mounting operation speed can be further increased.

Furthermore, according to the component mounting equipment of the present invention, by mounting mutually different components onto the component supply tables of the component mounting apparatuses arranged in parallel to one another, even when the types and the number of components to be mounted onto the circuit board increase, the equipment is not dimensionally increased as a whole without significantly expanding in the direction of the board transfer path. Furthermore, the component mounting operation speed can be further increased. In this case, there may be provided the structure in which all the components to be mounted onto single board are distributed into groups by type and the components of each group are mounted on component supply tables as assigned to them installed at the respective component mounting apparatuses. With this arrangement, when the types of boards increase, it can be coped with onlly by replacing a part of the component supply tables of the component mounting apparatuses with component supply tables mounted with the required components.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the claims unless they depart therefrom.

The invention claimed is:

1. A component mounting method comprising:

moving in first and second orthogonal directions a first mounting head section having first nozzles, rotating said first mounting head section such that said first nozzles rotate, and successively picking up components from a first component supply table arranged on one side of a board transfer path, with said first direction being perpendicular to said board transfer path and said second direction extending along said board transfer path; then successively mounting onto a board, positioned in said board transfer path, the components picked up by said first nozzles;

moving in third and fourth orthogonal directions a second mounting head section having second nozzles, rotating said second mounting head section such that said second nozzles rotate, and successively picking up components from a second component supply table arranged on an opposite side of said board transfer path, with said third direction being parallel to said first direction and said fourth direction being parallel to said second direction; then successively mounting onto said board, positioned in said board transfer path, the components picked up by said second nozzles.

2. The component mounting method according to claim 1, wherein successively picking up the components by said first nozzles occurs simultaneously with successively mounting the components picked up by said second nozzles, and successively picking up the components by said second nozzles occurs simultaneously with successively mounting the components picked up by said first nozzles.

3. The component mounting method according to claim 2, further comprising:

after mounting onto said board the components picked-up by said first nozzles and the components picked up by said second nozzles, transferring said board along said board transfer path to a board processing station.

4. The component mounting method according to claim 1, further comprising:

after mounting onto said board the components picked-up by said first nozzles and the components picked up by said second nozzles, transferring said board along said board transfer path to a board processing station.

5. A component mounting method comprising:

providing component mounting stations positioned along a board transfer path, each of said mounting stations including first and second mounting head sections and first and second component supply tables, each of said first mounting head sections having first nozzles, and each of said second mounting head sections having second nozzles;

delivering a board to said board transfer path;

at one of said component mounting stations, moving a corresponding one of said first mounting head sections in first and second orthogonal directions, rotating said corresponding one of said first mounting head sections such that said first nozzles of said corresponding one of said first mounting head sections rotate, and successively picking up components from a corresponding one of said first component supply tables arranged on one side of said board transfer path, with said first direction being perpendicular to said board transfer path and said second direction extending along said board transfer path; then successively mounting onto said board, positioned in said board transfer path, the components picked up by said first nozzles of said corresponding one of said first mounting head sections;

at said one of said component mounting stations, moving a corresponding one of said second mounting head sections in third and fourth orthogonal directions, rotating said corresponding one of said second mounting head sections such that said second nozzles of said corresponding one of said second mounting head sections rotate, and successively picking up components from a corresponding one of said second component supply tables arranged on an opposite side of said board transfer path, with said third direction being parallel to said first direction and said fourth direction being parallel to said second direction; then successively mounting onto said board, positioned in said board transfer path, the components picked up by said second nozzles of said corresponding one of said second mounting head sections.

6. The component mounting method according to claim 5, wherein successively picking up the components by said first nozzles of said corresponding one of said first mounting head sections occurs simultaneously with successively mounting the components picked up by said second nozzles of said corresponding one of said second mounting head sections, and successively picking up the components by said second nozzles of said corresponding one of said second mounting head sections occurs simultaneously with successively mounting the components picked up by said first nozzles of said corresponding one of said first mounting head sections.

7. The component mounting method according to claim 6, further comprising:

after mounting onto said board the components picked-up by said first nozzles of said corresponding one of said first mounting head sections and the components picked up by said second nozzles of said corresponding one of said second mounting head sections, transferring said board along said board transfer path to another one of said component mounting stations.

8. The component mounting method according to claim 5, further comprising:

after mounting onto said board the components picked-up by said first nozzles of said corresponding one of said first mounting head sections and the components picked up by said second nozzles of said corresponding one of said second mounting head sections, transferring said board along said board transfer path to another one of said component mounting stations.

* * * * *